(12) United States Patent
Nagahara

(10) Patent No.: US 6,323,529 B1
(45) Date of Patent: Nov. 27, 2001

(54) SEMICONDUCTOR ACCELERATION SENSOR AND A METHOD OF MANUFACTURING THE SAME

(75) Inventor: Teruaki Nagahara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/335,522

(22) Filed: Jun. 18, 1999

(30) Foreign Application Priority Data

Jan. 27, 1999 (JP) .................................................. 11-018336

(51) Int. Cl.$^7$ .................................................. H01L 29/82
(52) U.S. Cl. ........................ 257/420; 257/417; 257/415; 257/254
(58) Field of Search .................................... 257/254, 415, 257/417, 420, 414, 670, 667

(56) References Cited

U.S. PATENT DOCUMENTS 5,847,445 * 12/1998 Wark et al. .......................... 257/669
6,049,120 * 4/2000 Otani et al. .......................... 257/667

FOREIGN PATENT DOCUMENTS 7-225240   8/1995   (JP) .

* cited by examiner

Primary Examiner—Eddie Lee
Assistant Examiner—N. Drew Richards
(74) Attorney, Agent, or Firm—Oblon, Spivak, McClelland, Maier & Neustadt, P.C.

(57) ABSTRACT

A semiconductor acceleration sensor in which the acceleration sensor chip is protected from the resin molding of the package to assure good detection precision.

A semiconductor acceleration sensor in which functional elements including an acceleration sensor chip and signal-processing chip are sealed in a resin package, has a damping member disposed along an outside surface of the acceleration sensor chip to alleviate stress from the resin package on the acceleration sensor chip, and a plate-like covering member which cover a top edge part of the damping member and a top edge of the acceleration sensor chip. Resin is thus prevented from penetrating the gap between the sensor chip and damping member during the packaging process. The sensor chip is thus protected from stresses from the resin molding, and the semiconductor acceleration sensor can assure good detection precision.

6 Claims, 3 Drawing Sheets

SEMICONDUCTOR ACCELERATION SENSOR AND A METHOD OF MANUFACTURING THE SAME

BACKGROUND OF THE INVENTION

The present invention relates to a semiconductor acceleration sensor having such functional elements including an acceleration sensor chip and signal-processing chip sealed in a resin molding package, and to a method of manufacturing such a semiconductor acceleration sensor.

Airbag systems, antilock brake systems (ABS), and navigation systems are exemplary of the increasingly common automotive systems that rely on a semiconductor acceleration sensor to detect vehicle acceleration and impact. A semiconductor acceleration sensor typically comprises an acceleration sensor chip and a signal-processing chip in a package that both protects the internal chips from the external environment and determines the outside shape of the sensor unit. In many conventional systems, these packages are protected by a metal cover. As these systems have been adapted for smaller, lower priced vehicles, demand for compact, low cost systems has led to the adoption of systems in which the components are sealed in a molded resin package.

FIG. 6 is a section view of a resin sealed semiconductor acceleration sensor according to the related art. In this conventional semiconductor acceleration sensor 50, the acceleration sensor chip 53 is fixed to the die pad 61 by a die bond resin 63. The signal-processing chip 55 is mounted on the acceleration sensor chip 53, and is electrically connected via metal wires 59a to acceleration sensor chip 53. A plurality of outer leads 57 is disposed around the chips 53 and 55 with each outer lead 57 electrically connected to the signal-processing chip 55 via a metal wire 59b. The components are then secured in their specified positions and protected from the outside environment by resin molding 52, leaving only the outside parts of the outer leads 57 exposed.

The acceleration sensor chip typically detects acceleration or impact by detecting the minute displacement of a mass. As a result, it is preferably not exposed to external stresses other than that being detected. An acceleration sensor chip sealed in a resin molding as described above, however, is subject to stress produced by the expansion or contraction of the resin package resulting from changes in the temperature of the external environment. The offset and output sensitivity of the acceleration sensor depend on the temperature characteristics of the sensor and can vary greatly when this external stress exceeds a particular level, thereby making it difficult to assure good acceleration and impact detection precision.

To avoid this problem and absorb and alleviate stress from the resin molding 52 acting on the acceleration sensor chip 53, a damping member 54 made of rubber or other resilient material is typically provided around the outside surfaces of the acceleration sensor chip 53 in this conventional semiconductor acceleration sensor 50. In this example according to the related art, the damping member 54 is fixed to the outside circumference surface of the acceleration sensor chip 53 by way of die bond resin 63.

As described above, a damping member 54 surrounding the outside of the acceleration sensor chip 53 is used in this conventional semiconductor acceleration sensor 50 to absorb and buffer stress on the acceleration sensor chip 53 from the resin molding 52, and is sealed together with the acceleration sensor chip 53 and signal-processing chip 55 in the resin package. As will be understood from FIG. 7, however, the package resin 52 may displace the die bond resin between the damping member 54 and acceleration sensor chip 53 during the packaging process. When this happens, thermal expansion and contraction of resin 52a between the damping member 54 and acceleration sensor chip 53 will directly stress the acceleration sensor chip 53.

SUMMARY OF THE INVENTION

With consideration for the above-described problems, an object of the present invention is therefore to provide a semiconductor acceleration sensor, in which the acceleration sensor chip is protected from resin sealing the package, thereby assuring good detection precision.

In one aspect of the present invention, there is provided a semiconductor acceleration sensor in which functional elements including an acceleration sensor chip and signal processing chip are sealed in a resin package comprises a damping member disposed along the outside surfaces of the acceleration sensor chip to buffer stress from the resin package on the acceleration sensor chip, and a cover for covering a top edge part of the damping member and a top edge of the acceleration sensor chip.

The cover in this semiconductor acceleration sensor is preferably formed integrally with the damping member.

Alternatively, the damping member has a hollow layer formed heightwise to the damping member. In this case, the hollow layer is preferably filled with a gel type reinforcing filler. Yet further preferably, the reinforcing filler is a silicon gel. As a further alternative, the damping member can be formed integrally with the covering member and still be made with a hollow portion, or, as a further alternative, the hollow portion can be filled with a silicon gel.

In a further aspect of the present invention, there is a method of manufacturing a semiconductor acceleration sensor in which functional elements including an acceleration sensor chip and signal-processing chip are sealed in a resin package, comprising the steps of: disposing a damping member along an outside surface of the acceleration sensor chip to alleviate stress from the resin package on the acceleration sensor chip; and disposing a covering member which cover a top edge part of the damping member and a top edge of the acceleration sensor chip.

It is an advantageous effect according to the present invention that, since a semiconductor acceleration sensor has a damping member disposed along the outside surfaces of the acceleration sensor chip to buffer stress from the resin package on the acceleration sensor chip, and a covering member which cover a top edge part of the damping member and a top edge of the acceleration sensor chip, the chance of resin penetrating the gap between the sensor chip and damping member during the process in which the components of the semiconductor acceleration sensor are sealed with resin is eliminated. The sensor chip is thus protected from stresses from the resin package, and the semiconductor acceleration sensor can therefore assure good detection precision.

It is also an effect according to the present invention that, since the damping member is formed with the covering member, the number of parts is reduced, and thus the required manufacturing process is simplified.

It is further an effect according to the present invention that, since the damping member has a hollow layer heightwise to it, the lateral flexibility of the damping member is increased, thereby further enhancing the ability of the sensor chip to reliably absorb and alleviate stress on the sensor chip from the resin molding.

Furthermore when this hollow layer of the damping member is filled with a gel type reinforcing filler, the strength of the damping member is increased while retaining substantial lateral flexibility in the damping member. The reinforcing filler is preferably a silicon gel because of its outstanding resistance to aging and heat, and minimal change in viscosity as the temperature changes, thus achieving a damping member with stable lateral flexibility and strength.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1:
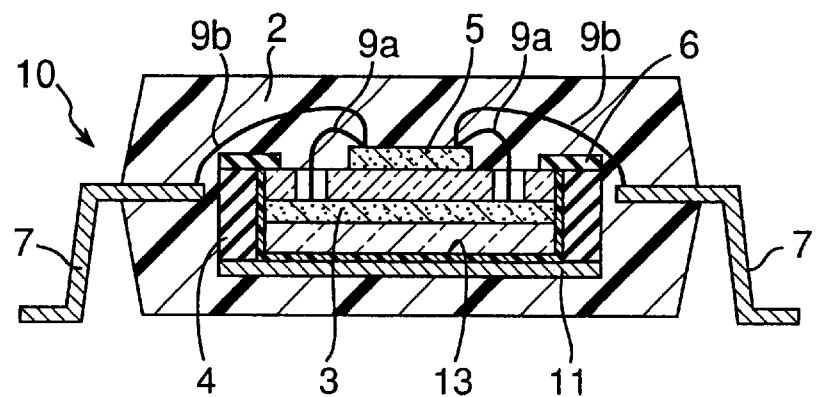
FIG. 1 is a section view of a semiconductor acceleration sensor according to a first embodiment of the present invention.
Figure 2:
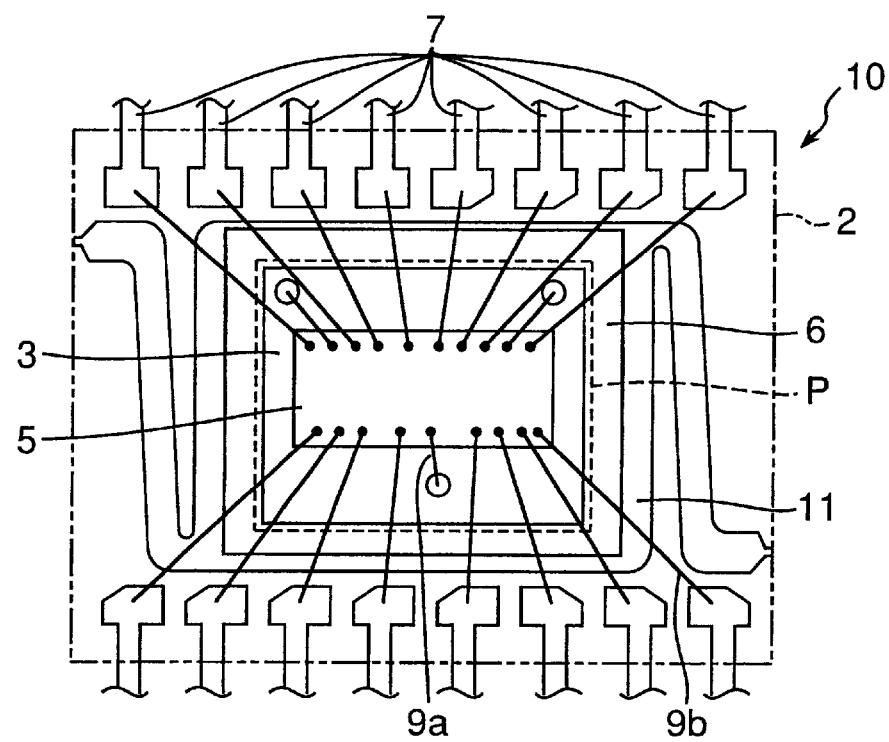
FIG. 2 is a plan view of a semiconductor acceleration sensor according to a first embodiment of the present invention.

The preferred embodiments of the present invention are described below with reference to the accompanying figures.
Embodiment 1:

FIG. 1 and FIG. 2 are a side section view and plan view, respectively, of a resin-sealed semiconductor acceleration sensor according to a first preferred embodiment of the present invention. Note that to show the internal structure of the semiconductor acceleration sensor in FIG. 2, the resin package is shown as being transparent with only the outside lines of the package indicated by imaginary line.

The semiconductor acceleration sensor 10 comprises an acceleration sensor chip 3 for detecting displacement of a mass, and a signal-processing chip 5 for calculating acceleration or impact based on the detected displacement. The sensor chip 3 has a three-layer structure of glass-silicon-glass, and is fixed to a die pad 11 with die bond resin 13. The signal-processing chip 5 is mounted on the sensor chip 3. The sensor chip 3 and signal-processing chip 5 are electrically connected to each other by metal wire 9a such as gold wire.

As shown in FIG. 2, a plurality of outer leads 7 that are the external terminals of the semiconductor acceleration sensor 10 are arrayed along both long edges of the sensor 10 (top and bottom sides as seen in FIG. 2). Each of these outer leads 7 is electrically connected to the signal-processing chip 5 by metal wires 9b. The components of the semiconductor acceleration sensor 10 are then secured in their specified positions and protected from the outside environment by resin molding 2, leaving only the outside parts of the outer leads 7 exposed.

An exemplary resin molding 2 is made from epoxy resin in this preferred embodiment. As indicated by the imaginary line in FIG. 2, this resin molding 2 also defines the outside shape of the semiconductor acceleration sensor 10.

To absorb and buffer stress resulting from the expansion and contraction of the resin molding 2 when the environmental temperature changes, a damping member 4 as known from the related art covers the outside surfaces of the sensor chip 3 in this semiconductor acceleration sensor 10. The damping member 4 is annularly shaped, and the inside circumference surface thereof is fixed to the outside circumference surface of the sensor chip 3 with die bond resin 13 therebetween. The height of the damping member 4 is determined such that the top edge of the damping member 4 is flush with the top surface of the sensor chip 3. Note that the damping member 4 is made from a resilient material such as rubber.

A plate-like covering member 6 is further disposed to cover the top edges of the damping member 4 and the sensor chip 3, in this first embodiment. The covering member 6 is also made from a resilient material such as rubber. The bonding interface between the damping member 4 and sensor chip 3 is indicated by dotted line P in FIG. 2.

By thus covering the top edge of the damping member 4 and the top edge of the sensor chip 3 with a covering member 6, the chance of resin penetrating the gap between the sensor chip 3 and damping member 4 during the process in which the components of the semiconductor acceleration sensor 10 are sealed with resin is eliminated. As a result, the sensor chip 3 is protected from stresses applied from the resin molding 2, and the semiconductor acceleration sensor 10 can therefore assure good detection precision.

Figure 3:
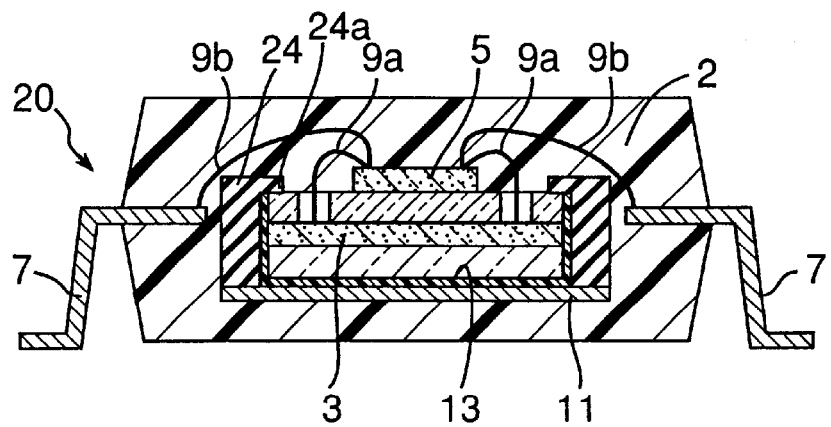
FIG. 3 is a section view of a semiconductor acceleration sensor according to a second embodiment of the present invention.

Further embodiments of the present invention are described next below with reference to the accompanying figures wherein like parts are indicated by like reference numerals. Further description of such like parts is therefore omitted below.
Embodiment 2:

FIG. 3 is a side section view of a resin sealed semiconductor acceleration sensor according to a second preferred embodiment of the present invention. This semiconductor acceleration sensor 20 comprises a damping member 24 formed integrally with the covering member provided in a semiconductor acceleration sensor 10 according to the first embodiment.

More specifically, the damping member 24 is disposed circumferentially to the outside of the sensor chip 3 as in the first embodiment to absorb and alleviate stress originating from the contraction and expansion of the resin molding 2 due to changes in external temperature. Additionally in this second embodiment, the damping member 24 further comprises a flange 24a from the top edge thereof toward the radial center of the damping member 24. As a result, the damping member 24 has an L-shaped cross section with the flange 24a projecting from the side top to the inside of the damping member 24. This damping member 24 thus has an annular shape, and is made of rubber or other resilient material.

When the damping member 24 is disposed to the sensor chip 3, the end of the flange 24a contacts the top outside edge of the sensor chip 3. By thus closing the opening to the gap between the damping member 4 and the sensor chip 3 with the flange 24a, the chance of resin penetrating this gap during the process in which the components of the semiconductor acceleration sensor 10 are sealed with resin is eliminated.

As a result, the sensor chip 3 is protected from stresses applied from the resin molding 2, and the semiconductor acceleration sensor 20 can therefore assure good detection precision. In this second embodiment, the number of parts is also reduced by thus integrating the covering member of the first embodiment with the damping member 24 and the manufacturing process can therefore be simplified.

Figure 4:
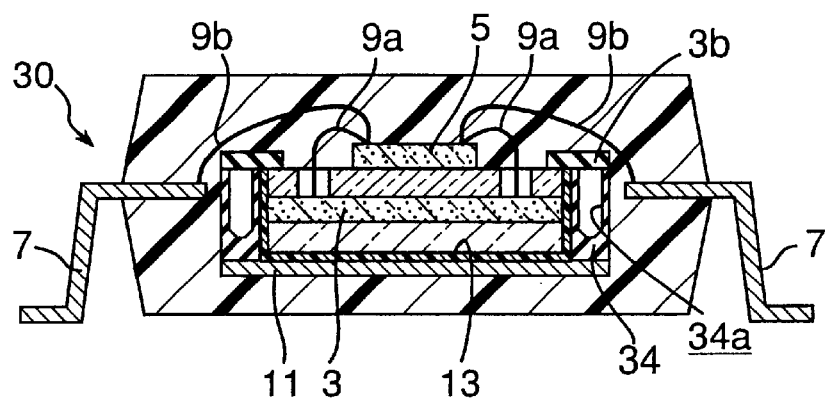
FIG. 4 is a section view of a semiconductor acceleration sensor according to a third embodiment of the present invention.

Embodiment 3:

FIG. 4 is a side section view of a resin-sealed semiconductor acceleration sensor according to a third preferred embodiment of the present invention. This semiconductor acceleration sensor 30 also has a damping member 34 disposed circumferentially to the outside of the sensor chip 3 to absorb and alleviate stress originating from the contraction and expansion of the resin molding 2 due to changes in external temperature. The damping member 34 of this embodiment has a hollow layer 34a formed heightwise in the damping member 34. The open end of this hollow layer 34a is closed by a covering member 6 disposed to close the top edge of the damping member 34 and the top edge of the sensor chip 3, thus trapping air inside the hollow layer 34a.

Thus disposing a hollow layer 34a heightwise to the damping member 34 increases the lateral flexibility of the damping member 34, thereby further enhancing the ability of the sensor chip 3 to reliably absorb and alleviate stress on the sensor chip 3 from the resin molding 2.

Figure 5:
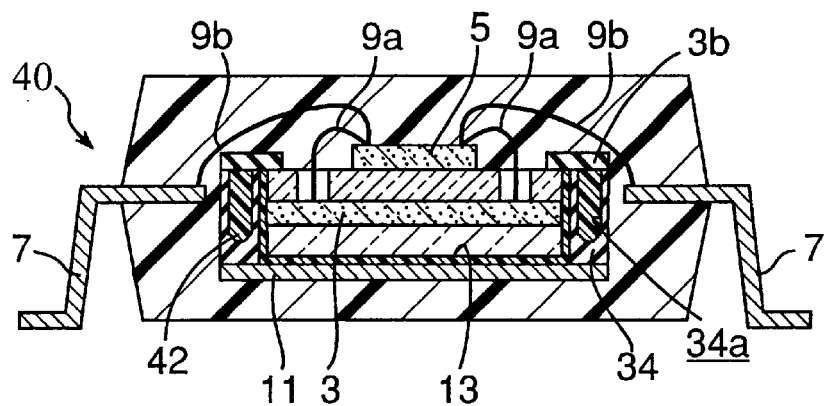
FIG. 5 is a section view of a semiconductor acceleration sensor according to a fifth embodiment of the present invention.
Figure 6:
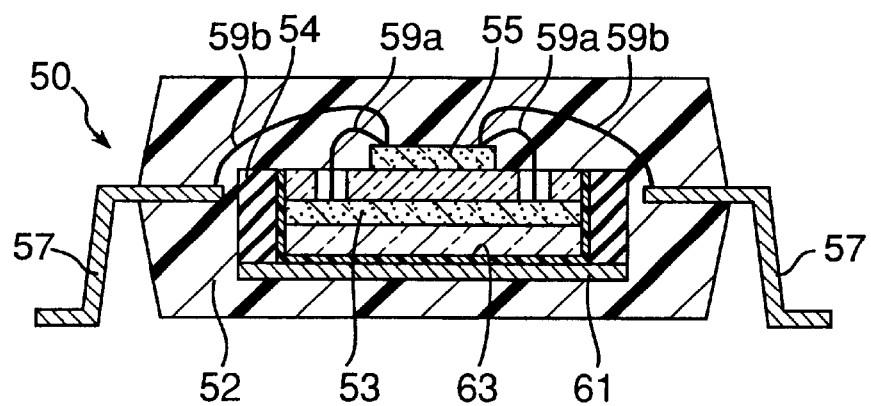
FIG. 6 is a section view of a semiconductor acceleration sensor according to the related art.
Figure 7:
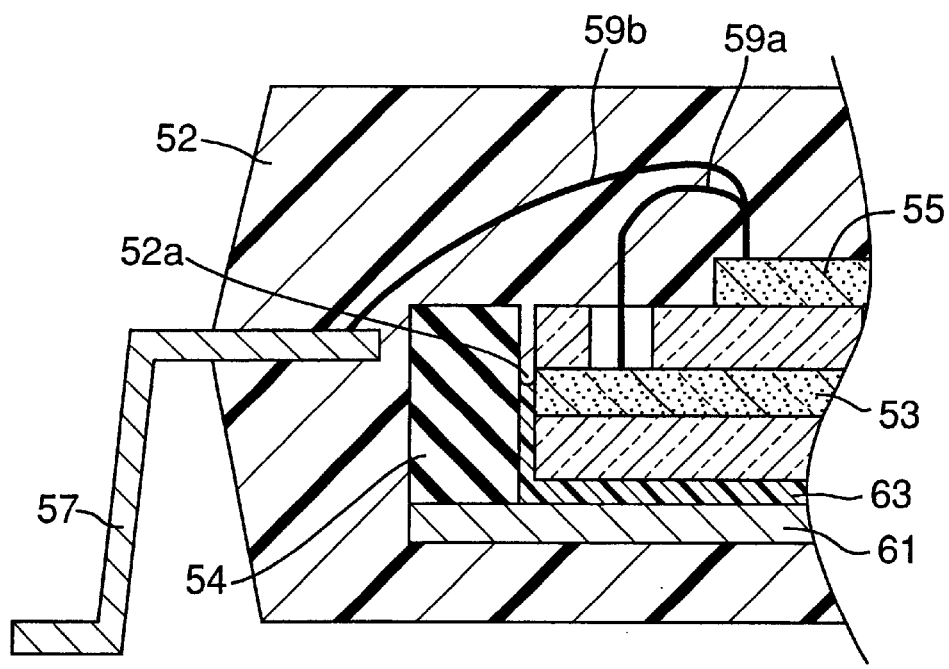
FIG. 7 is a partially enlarged section view of the semiconductor acceleration sensor shown in FIG. 6.

Embodiment 4:

FIG. 5 is a side section view of a resin-sealed semiconductor acceleration sensor according to a fourth preferred embodiment of the present invention. This semiconductor acceleration sensor 40 fills the hollow layer 34a in the damping member 34 of the above third embodiment with a gel type reinforcing filler 42. This reinforcing filler 42 improves the strength of the damping member 34 compared with a hollow layer 34a filled only with air while also retaining substantial lateral flexibility in the damping member 34.

An exemplary reinforcing filler 42 is silicon gel because of its outstanding resistance to aging and heat, and minimal change in viscosity as the temperature changes. A damping member 34 with stable lateral flexibility and strength can thus be achieved.

It will be obvious to one with ordinary skill in the related art that the present invention shall not be limited to the above-described preferred and that various modifications are possible within the scope of the accompanying claims. For example, the damping member and covering member are described above as made from rubber or other resilient material, but the invention shall not be so limited. More specifically, the damping member and covering member can be made of plastic or other rigid resin insofar as the material is suitable for absorbing and alleviating stress from the resin molding, and covering the top edge of the damping member and the top edge of the acceleration sensor chip.

What is claimed is:

1. A semiconductor acceleration sensor in which functional elements including an acceleration sensor chip and signal-processing chip are sealed in a resin package, comprising:

a damping member disposed along an outside circumference surface of the acceleration sensor chip to alleviate stress from the resin package on the acceleration sensor chip, wherein the damping member has a hollow layer formed heightwise to the damping member; and a covering member for covering a top edge part of the damping member and a top edge of the acceleration sensor chip.

2. The semiconductor acceleration sensor according to claim 1 wherein the damping member is formed integrally with the covering member.

3. The semiconductor acceleration sensor according to claim 1 wherein the hollow layer of the damping member is filled with a gel type reinforcing filler.

4. The semiconductor acceleration sensor according to claim 3 wherein the reinforcing filler is a silicon gel.

5. The semiconductor acceleration sensor according to claim 2 wherein the hollow layer of the damping member is filled with a gel type reinforcing filler.

6. The semiconductor acceleration sensor according to claim 5 wherein the reinforcing filler is a silicon gel.

* * * * *